United States Patent
Maki

(10) Patent No.: US 9,306,512 B2
(45) Date of Patent: Apr. 5, 2016

(54) ASK MODULATION AMPLIFICATION CIRCUIT

(71) Applicant: KABUSHIKI KAISHA TOSHIBA, Tokyo (JP)

(72) Inventor: Asuka Maki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 14/016,193

(22) Filed: Sep. 2, 2013

(65) Prior Publication Data
US 2014/0184338 A1 Jul. 3, 2014

(30) Foreign Application Priority Data

Dec. 28, 2012 (JP) ................. 2012-287797

(51) Int. Cl.
*H03F 3/38* (2006.01)
*H03F 3/193* (2006.01)
*H03F 1/02* (2006.01)
*H03F 1/22* (2006.01)
*H03F 3/24* (2006.01)
(Continued)

(52) U.S. Cl.
CPC .............. *H03F 3/193* (2013.01); *H03F 1/0261* (2013.01); *H03F 1/223* (2013.01); *H03F 3/245* (2013.01); *H03F 3/45179* (2013.01); *H03F 3/217* (2013.01); *H03F 2200/327* (2013.01); *H03F 2200/411* (2013.01); *H03F 2203/45394* (2013.01); *H03F 2203/45594* (2013.01); *H03F 2203/45596* (2013.01); *H03F 2203/45638* (2013.01); *H03F 2203/45674* (2013.01)

(58) Field of Classification Search
CPC ......... H03F 3/211; H03F 3/245; H03F 3/193; H03F 1/0277; H03F 3/68; H03F 1/0261; H03F 2200/411; H03F 2200/451; H03F 3/195; H03F 1/0227; H03F 2200/387; H03F 2200/222; H03F 2200/318; H03F 3/602
USPC ............ 330/10, 253, 261, 278, 285, 296, 311
See application file for complete search history.

(56) References Cited

U.S. PATENT DOCUMENTS 5,559,471 A * 9/1996 Black ............................ 330/296
6,236,266 B1 * 5/2001 Choumei et al. .............. 330/296
(Continued)

FOREIGN PATENT DOCUMENTS

JP    2004-140837 A    5/2004
JP    2006-067467      3/2006
(Continued)

OTHER PUBLICATIONS

Japanese Office Action with English translation, Patent Application No. JP 2012-287797, dated Jul. 21, 2015, 8 pages.

*Primary Examiner* — Khanh V Nguyen
(74) *Attorney, Agent, or Firm* — Patterson & Sheridan, LLP

(57) ABSTRACT

An amplitude shift keying (ASK) modulation amplifier circuit includes a first amplifier to which a high frequency signal and a modulating signal are supplied, and that is configured to perform an amplification of the high frequency signal and an ASK modulation, and a second amplifier to which an output of the first amplifier and the modulating signal are supplied, and that is configured to perform an amplification of the output signal from the first amplifier and an ASK modulation. In some configurations, an amplification gain of the second amplifier is set higher than an amplification gain of the first amplifier.

10 Claims, 2 Drawing Sheets

Figure 1:
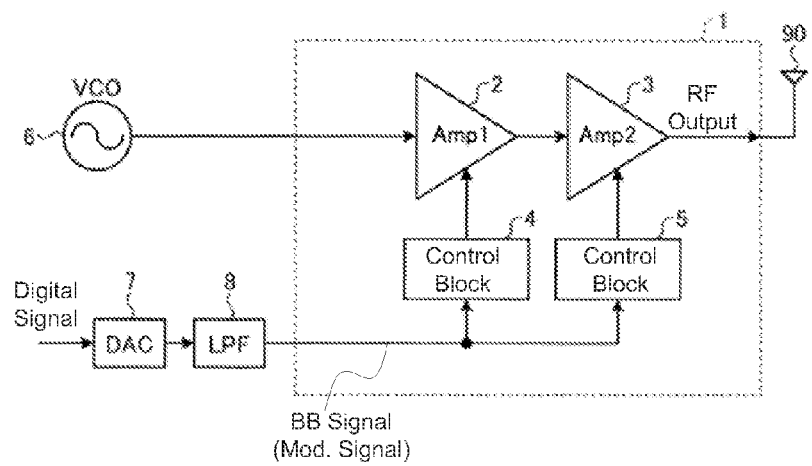

(51) Int. Cl.
*H03F 3/45* (2006.01)
*H03F 3/217* (2006.01)

(56) References Cited

U.S. PATENT DOCUMENTS

| | | | |
|---|---|---|---|
| 7,193,460 B1 * | 3/2007 | Naik et al. | 330/296 |
| 7,660,564 B2 * | 2/2010 | Lee | 330/296 |
| 7,863,983 B2 * | 1/2011 | Yuen et al. | 330/285 |
| 8,098,102 B2 * | 1/2012 | Hase et al. | 330/285 |
| 8,368,462 B2 * | 2/2013 | Sharma et al. | 330/10 |
| 2012/0319074 A1 | 12/2012 | Fujii et al. | |

FOREIGN PATENT DOCUMENTS

| | | |
|---|---|---|
| JP | 2006-067467 A | 3/2006 |
| JP | 2007-158214 A | 6/2007 |
| JP | 2007-174553 A | 7/2007 |

\* cited by examiner

ASK MODULATION AMPLIFICATION CIRCUIT

CROSS REFERENCE TO RELATED APPLICATION

This application is based upon and claims the benefit of priority from Japanese Patent Application No. 2012-287797, filed Dec. 28, 2012, the entire contents of which are incorporated herein by reference.

TECHNICAL FIELD

Embodiments of the present invention relate to an amplitude shift keying (ASK) modulation amplifier circuit that performs an amplification of high frequency signals and an amplitude shift keying (ASK) modulation at the same time.

BACKGROUND

Conventionally, in order to improve a linear characteristic and a modulation factor of the ASK modulation, a technique by which high frequency signals (or HF signals) are amplified according to levels of modulating signals has been disclosed.

In order to increase the modulation factor, it is important to reduce a modulating output signal that is generated at the time when the level of the input signal is low. On the other hand, in order to output a modulating output signal with a large amplification, it is necessary to set an amplifier's gain high. Due to the incompatibility of reducing the modulating output signal and the need to obtain a modulating output signal that has a large amplification, there is a need for further development, i.e., for a device that can provide a modulating output signal with large amplification while reducing the modulating output signal.

SUMMARY

In some embodiments, to achieve the above compatibility, namely to provide an ASK modulation amplifier circuit that is able to reduce the modulating output signal that is generated at the time when the level of the modulating signal is low and to obtain the modulating output signal with the large amplification gain.

According to one embodiment of the present invention, an amplitude shift keying (ASK) modulation amplifier circuit is provided, which includes a first amplifier to which a high frequency signal and a modulating signal are supplied, and that is configured to perform an amplification of the high frequency signal and an ASK modulation, and a second amplifier to which an output of the first amplifier and the modulating signal are supplied, and that is configured to perform an amplification of the output signal from the first amplifier and an ASK modulation. Wherein an amplification gain of the second amplifier is set higher than an amplification gain of the first amplifier.

BRIEF DESCRIPTIONS OF DRAWINGS

Figure 2:
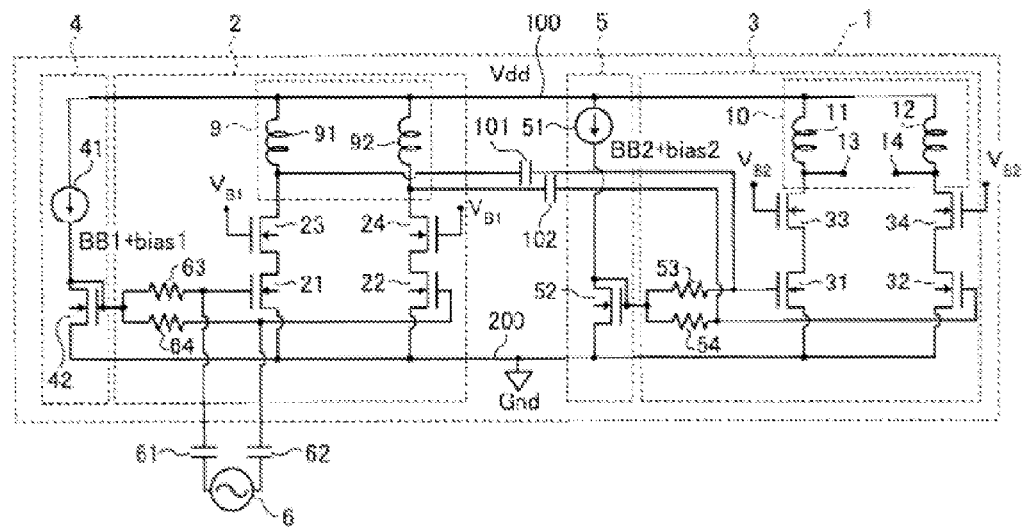
Figure 3:
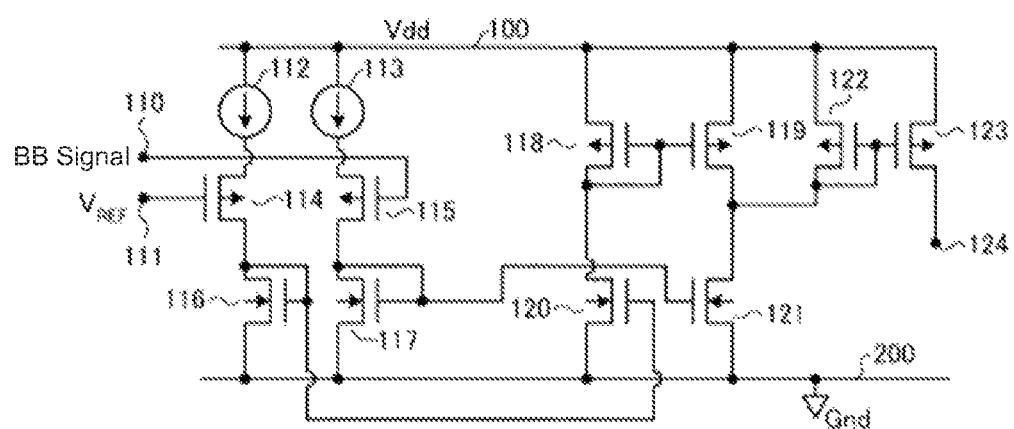

FIG. 1 illustrates an ASK modulation amplifier circuit according to a first embodiment.
FIG. 2 illustrates an ASK modulation amplifier circuit according to a second embodiment.
FIG. 3 illustrates a control block according to one embodiment.

DETAILED DESCRIPTIONS OF EMBODIMENT(S)

An ASK modulation amplifier circuit regarding the embodiments are explained in detail below with reference to the attached drawings. It is noted that the embodiments do not limit the scope of the invention.

First Embodiment

FIG. 1 illustrates an ASK modulation amplifier circuit according to a first embodiment. The ASK modulation amplifier circuit has a first amplifier 2. A high frequency signal, for example, within the 5.8 GHz band is supplied to the ASK modulation amplifier circuit from a high frequency signal source 6. A modulating signal (or BB signal) is supplied to the first amplifier 2. The modulation signal (BB signal) is converted by a digital to analog converter (DAC converter 7) from digital signal, which is either one or zero to an analog signal that has a wave-form shape, by a low pass filter (LPF 8). The analog signal emitted from the LPF 8 is supplied to a first control block 4. The first control block 4 converts the modulating signal (BB signal) to a current and supplies the current as a bias current. The first control block 4 controls the bias of the first amplifier 2, specifically, in a state where no modulating signal (BB signal) is supplied. In other words, when the first control block 4 delivers a control signal that is equal to a digital value zero, the first amplifier 2 will provide no modulating output signal. By use of the control block, it is possible to reduce the modulating output signal provided by the first amplifier 2 when the level of the modulating signal (BB signal) is low.

An output signal of the first amplifier 2 is supplied to a second amplifier 3. A second control block 5 converts the modulating signal (BB signal) to a current and supplies the current as a bias current to the second amplifier 3. The second amplifier 3 has a higher amplification gain than the first amplifier 2. The second amplifier 3 amplifies the output signal from the first amplifier 2 to form an ASK modulating output signal with a large amplitude gain. By increasing the bias current that is supplied from the second control block 5, it is possible to set the modulation ratio of the second amplifier 3. The Ask modulating output of the second amplifier 3 can then be transmitted from an antenna 90.

According to the first embodiment, each of the bias of the first amplifier 2 and second amplifier 3 can be respectively controlled by the first control block 4 and second control block 5. Thereby, in the first amplifier 2, it is possible to reduce the modulating output signal that is provided when the level of the modulating signal (BB signal) is low. On the other hand, in the second amplifier 3, it is possible to amplify the modulating output signal from the first amplifier 2 with a high amplification gain, to transmit the modulating signal with the large amplitude gain from the antenna 90, when the level of the modulating signal (BB signal) is high. Since the reduced modulating output signal is generated when the level of the modulating signal (BB signal) is low and the modulating output signal with the large amplitude gain is generated at the time when the modulating signal (BB signal) is high, the modulation factor is improved between these two states.

Second Embodiment

FIG. 2 illustrates a circuit diagram of the second embodiment. For elements that correspond to the elements of the first embodiment in FIG. 1, the descriptions are omitted by using the same reference numerals as the first embodiment. A first amplifier 2 has a differential pair that comprises first and second NMOS transistors 21 and 22 of which source electrodes are commonly connected. The source electrodes of the first and second NMOS transistors 21 and 22 is connected to a second power source line 200 to which a standard potential (Gnd) is applied. A high frequency signal, for example in a 5.8 GHz band, is supplied to gate electrodes of the first and second NMOS transistors 21 and 22 through coupling capacitors 61 and 62. The first amplifier 2 has a load circuit 9. The load circuit 9 has inductance elements 91 and 92. The inductance elements 91 and 92 are connected to a first power source line 100 to which a source voltage (Vdd) at a high potential side is applied. The load circuit 9 and the drain electrodes of the first and second NMOS transistors 21 and 22 that configure the differential pair are connected through NMOS transistors 23 and 24 for isolation. A predetermined bias voltage ($V_{B1}$) is applied to gate electrodes of NMOS transistors 23 and 24 for isolation.

A bias current is supplied to the first amplifier 2 from the first control block 4. The first control block 4 has a modulating signal component (BB1) and a power source 41 including a direct current component (bias 1). The power source 41 is connected to a drain electrode of a third NMOS transistor 42. A source electrode of the third NMOS transistor 42 is connected to the second power source line 200 to which the standard potential (Gnd) is applied. The gate electrode of the third NMOS transistor 42 is connected to the gate electrodes of the first and second NMOS transistors 21 and 22 through resistances 63 and 64 for bias (or bias resistances). The drain electrode and gate electrode of the third NMOS transistor 42 are commonly connected. Because the gate electrode of the third NMOS transistor 42 and the gate electrodes of the first and second NMOS transistors 21 and 22 are connected through the bias resistances 63 and 64, a potential between the gate electrodes of the first and second NMOS transistors 21 and 22, namely, the bias point of the first and second NMOS transistors 21 and 22, which configures the differential pair is set to the current value of the power source 41. By properly setting the current value of the power source 41, it is possible to adjust the bias point of the first amplifier 2 including the first and second NMOS transistors 21 and 22 to configure the differential pair, and to realize a bias setting in which no modulating output signal is output from the first amplifier 2 in a state where no modulating signal (BB signal) is supplied. With such a setting, it is possible to reduce the modulating output signal at times when the level of the modulating signal is low.

The second amplifier 3 has a differential pair of fourth and fifth NMOS transistors 31 and 32 of which the source electrodes are commonly connected. The source electrodes of the first and second NMOS transistors 21 and 22 are connected to the second power source line 200 to which a standard potential (Gnd) is applied. An output of the first amplifier 2 is supplied to gate electrodes of the fourth and fifth NMOS transistors 31 and 32 though coupling capacitances 101 and 102. The second amplifier 3 has a load circuit 10. The load circuit 10 has inductance elements 11 and 12. The inductance elements 11 and 12 are connected to a first source line 100. A load circuit 10 and the drain electrodes of the fourth and fifth NMOS transistors 31 and 32, which configure the differential pair, are connected through NMOS transistors 33 and 34 for isolation (or isolation NMOS transistor). A predetermined bias voltage ($V_{B2}$) is applied to gate electrodes of the isolation NMOS transistors 33 and 34.

A bias current is supplied to the second amplifier 3 from the second control block 5. The second control block 5 has a current source 51 including a modulating signal component (BB2) and a direct current component (bias 2). The power source 51 is connected to a drain electrode of a NMOS transistor 52. A source electrode of the sixth NMOS transistor 52 is connected to a second power source line 200 to which the standard potential (Gnd) is applied. Gate electrodes of the sixth NMOS transistor 52 are respectively connected to the gate electrodes of the fourth and fifth NMOS transistors 31 and 32 through resistances 53 and 54 for bias (bias resistances). The drain electrode and the gate electrodes of the sixth NMOS transistor 52 are commonly connected. Because the gate electrodes of the sixth NMOS transistor 52 and the gate electrodes of the fourth and fifth NMOS transistors 31 and 32 are connected through the bias resistances 53 and 54, potentials of the gate electrodes of the fourth and fifth NMOS transistors 31 and 32, namely bias points of the fourth and fifth NMOS transistors 31 and 32, can be set by the current value of the power source 51. By properly setting the current value of the power source 51, it is possible to adjust the bias point of the second amplifier 3, which includes the fourth and fifth NMOS transistors 31 and 32 that configure the differential pair.

In order to output the modulating output signal from the first amplifier 2 after the signal is adequately amplified, the amplification gain of the second amplifier 3 is set high. Specifically, a current of the power source 51 is set larger than that of the power source 41. In one configuration, the current value of the bias current delivered from the power source 51 is larger than a current value of the bias current delivered from the power source 41. The amplification gain of the first amplifier 2 may be increased by enlarging the size of the fourth and fifth NMOS transistors 31 and 32, which configure the differential pair, to enhance the driving capacity. Also, the fourth and fifth NMOS transistors 31 and 32 and the load circuit 10 may be formed in a parallel connection structure with multiple layers, and it may be realized to adjust the amplification gain by adjusting the number of the layers. By configuring the load circuit 10 of the second amplifier 3 with inductance elements 11 and 12, it is possible to enhance an output level of the direct output up to a power source voltage (Vdd) that is supplied to the first power source line 100.

An ASK modulating output signal amplified by the second amplifier 3 is output from output terminals 13 and 14. A capacitance and inductance or a matching circuit configured with capacitances, for example is connected to the output terminals 13 and 14. A differential output emerged at the output terminals 13 and 14 is converted to a single output and delivered from an antenna (not shown).

According to the embodiments, each of the bias points of the first and second amplifiers 2 and 3 can be independently set by setting the current values of the power sources 41, 51 of the first and second control blocks 4 and 5. For the first amplifier 2, a bias setting is selected in which the modulating output signal is not output by the first control block 4 when no modulating signal is supplied is created. Therewith, it is possible to sufficiently reduce the modulating output signal that is created at the time when the level of the modulating signal is low. For the second amplifier 3, a setting is selected in which the output signal of the first amplifier 2 is amplified with a sufficiently high amplification gain by the second control block 5 is created. Therewith, it is possible to obtain a modulating output signal with a large amplitude gain when the level of the modulating signal is high. Since the reduced modulating output signal is generated when the level of the modulating signal (BB signal) is low and the modulating output signal with the large amplitude gain is generated at the time when the modulating signal (BB signal) is high, the modulation factor is improved between these two states.

FIG. 3 illustrates one embodiment of a control block. The control block has PMOS transistors 114 and 115 are configured as a differential pair. A reference voltage ($V_{REF}$) having a predetermined constant voltage is applied to a gate electrode of the PMOS transistor 114. A modulating signal (BB signal) is applied to a gate electrode of the PMOS transistor 115. Constant current sources 112 and 114 are respectively connected to source electrodes of the PMOS transistors 114 and 115. A drain electrode of the PMOS transistor 114 is connected to a drain electrode of a NMOS transistor 116. A source electrode of the NMOS transistor 116 is connected to a second power source line 200 to which a standard potential (Gnd) is applied. A drain electrode of the PMOS transistor 115 is connected to a drain electrode of a NMOS transistor 117. A source electrode of the NMOS transistor 117 is connected to the second power source line 200. The drain electrode and gate electrode of the NMOS transistor 116 are connected to a gate electrode of a transistor 120. A source electrode of the NMOS transistor 120 is connected to the second power source line 200. The NMOS transistor 116 and NMOS transistor 120 configure a current mirror circuit.

A drain electrode of the NMOS transistor 120 is connected to a drain electrode of the PMOS transistor 118. A source electrode of the PMOS transistor 118 is connected to a first power source line 100 to which a power source voltage (Vdd) at a high potential side is applied. Drain electrode and gate electrode of the NMOS transistor 117 are connected to a gate electrode of the NMOS transistor 121. A source electrode of the NMOS transistor 121 is connected to the second power source line 200. The NMOS transistor 117 and the NMOS transistor 121 configure a current mirror circuit.

A drain electrode of the NMOS transistor 121 is connected to a drain electrode of the PMOS transistor 119. Gate electrodes of the PMOS transistor 118 and the PMOS transistor 119 are commonly connected, and are connected to the drain electrode of the PMOS transistor 118. The PMOS transistor 118 and the PMOS transistor 119 configure a current mirror circuit. The drain electrode of the PMOS transistor 119 is connected to a drain electrode of the PMOS transistor 122.

A source electrode of the PMOS transistor 122 is connected to the first power source line 100. A drain electrode and a gate electrode of the PMOS transistor 122 are connected to a gate electrode of the PMOS transistor 123. A source electrode of the PMOS transistor 123 is connected to the first power source line 100. The PMOS transistor 122 and the PMOS transistor 123 form a current mirror circuit. An output terminal 124, which is connected to the drain electrode of the PMOS transistor 123, is an output terminal of the control block. An output terminal of the current source 41 of the first control block 4 illustrated in FIG. 2 corresponds to the output terminal 124.

In the control block, a modulating signal (BB signal) supplied to a terminal 110 and a reference voltage ($V_{REF}$) supplied to a terminal 111 are compared with the PMOS transistor 114 and the PMOS transistor 115, the differential signal is overlapped to current values of the constant current sources 112 and 113, and is output from the output terminal 124. The differential signal of the modulating signal (BB signal) and the reference voltage ($V_{REF}$) is modulating signal components BB1 and BB2 that are supplied to the amplifiers 2 and 3. Current values of the constant current sources 112 and 113 are adjusted at the transistors 116 through 123, which configure the current mirror circuits, are direct current bias components (bias1) and (bias2).

It is practical that basic structures of the first and second control block are identical. As for the first control block 4 of the first amplifier 2, by adjusting sizes of the transistors 118 though 123, which form the current mirror circuits, the current value obtained from the output terminal 124 is set such that the modulating output signal is not delivered from the first amplifier 2 when no modulating signal (BB signal) is supplied. Using this configuration, it is possible to reduce the modulating output signal in a state where the level of the modulating signal (BB signal) is low. As for the second control block 5 of the second amplifier 3, in order to obtain a sufficient amplification gain of the second amplifier 3, a current value output from the output terminal 124 is set relatively high to obtain a modulating output signal that has a large amplitude gain when the modulating signal (BB signal) is at a high level. For example, it is possible to adjust a current mirror ratio by adjusting the sizes of the transistors 118 though 123 configuring the current mirror circuits, and to increase the current value obtained from the output terminal 124. Additionally, the first and second control blocks 4 and 5 may be configured with two or more amplifiers by having the constant current sources 112 and 113, the PMOS transistors 114 and 115, and the NMOS transistors 116 and 117 remain the same as shown in FIG. 3 and the transistors such as the transistors 118 through 123 being added.

Although the embodiments described herein include two amplifiers, this configuration is not intended to be limiting as to the scope of the invention described herein. It may be practical to modify the configuration by adding additional amplifiers and by enhancing the amplification gain of the amplifier at a rear side, so that the configuration is able to further amplify and to output the ASK modulating output signal. Also, instead of the MOS transistor, it is possible to configure it with a bipolar transistor.

Embodiments of the invention may provide an amplitude shift keying (ASK) modulation amplifier circuit, having a first amplifier to which a high frequency signal and a modulating signal are supplied, wherein the first amplifier is configured to perform an amplification of the high frequency signal and an ASK modulation. The amplitude shift keying (ASK) modulation amplifier circuit may further include a second amplifier to which an output of the first amplifier and the modulating signal are supplied, and that is configured to perform an amplification of the output signal from the first amplifier and an ASK modulation, wherein an amplification gain of the second amplifier is set higher than an amplification gain of the first amplifier.

While certain embodiments have been described, these embodiments have been presented by way of example only; and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modulations as would fall within the scope and spirits of the inventions.

What is claimed is:

1. An amplitude shift keying (ASK) modulation amplifier circuit, comprising:
    a first amplifier to which a high frequency signal and a modulating signal are supplied, and that is configured to perform an amplification of the high frequency signal and an ASK modulation;
    a second amplifier to which an output of the first amplifier and the modulating signal are supplied, and that is configured to perform an amplification of the output signal from the first amplifier and an ASK modulation;

a first control block that supplies the modulating signal together with a first bias current to the first amplifier; and a second control block that supplies the modulating signal together with a second bias current to the second amplifier, wherein the first amplifier comprises:

first and second MOS transistors having source electrodes and gate electrodes, the source electrodes being commonly connected, and a high frequency signal being supplied to the gate electrodes, a first load circuit that is connected to the first and second MOS transistors, and a third MOS transistor having a source electrode, a gate electrode, and a drain electrode, the gate electrode being connected to the gate electrodes of the first and second MOS transistors, the source electrode being connected to the source electrodes of the first and second MOS transistors, and an output of the first control block being supplied to the drain electrode of the third MOS transistor, and wherein an amplification gain of the second amplifier is set higher than an amplification gain of the first amplifier.

2. The ASK modulation amplifier circuit according to claim 1, wherein the second amplifier comprises fourth and fifth MOS transistors having source electrodes and gate electrodes, the source electrodes being commonly connected, and an output of the first amplifier being supplied to each of the gate electrodes, a second load circuit that is connected to drain electrodes of the fourth and fifth MOS transistors, and a sixth MOS transistor having a source electrode, a gate electrode and a drain electrode, the gate electrode being connected to the gate electrodes of the fourth and fifth MOS transistors, the source electrode being connected to the source electrodes of the fourth and fifth MOS transistors, and an output of the second control block is supplied to the drain electrode of the sixth MOS transistor.

3. The ASK modulation amplifier circuit according to claim 2, wherein a current value of the bias current of the second control block is larger than a current value of the bias current of the first control block.

4. The ASK modulation amplifier circuit according to claim 1, wherein a current value of the bias current of the second control block is larger than a current value of the bias current of the first control block.

5. A method of providing an amplitude shift keying (ASK) modulating output signal, comprising:

receiving a high frequency signal and an input modulating signal at a first amplifier that is supplied with the input modulating signal together with a first bias current by a first control block, the first amplifier comprising first and second MOS transistors having source electrodes and gate electrodes, the source electrodes being commonly connected, and a high frequency signal being supplied to the gate electrodes, a first load circuit that is connected to the first and second MOS transistors, and a third MOS transistor having a source electrode, a gate electrode, and a drain electrode, the gate electrode being connected to the gate electrodes of the first and second MOS transistors, the source electrode being connected to the source electrodes of the first and second MOS transistors, and an output of the first control block being supplied to the drain electrode of the third MOS transistor;

generating a first output from the first amplifier, wherein generating the first output comprises:

amplifying the high frequency signal; and forming an ASK modulating signal from the received high frequency signal and the input modulating signal;

receiving, at a second amplifier that is supplied with the input modulating signal together with a second bias current from a second control block, the first output signal; and generating a second output from the second amplifier, wherein generating the second output comprises amplifying the formed ASK modulating signal.

6. The method of claim 5, wherein an amplification gain of the second amplifier is greater than an amplification gain of the first amplifier.

7. The method of claim 5, wherein the input modulating signal comprises an analog waveform.

8. The method of claim 7, wherein the waveform essentially comprises a low state and a high state.

9. The method of claim 5, wherein the input modulating signal comprises a low state and a high state, wherein forming the ASK modulating signal comprises generating at least a portion of the ASK modulating signal when the input modulating signal is in the low state.

10. The method of claim 5, wherein the second output is provided to an antenna.

* * * * *